United States Patent
Wu et al.

(10) Patent No.: US 9,214,288 B2
(45) Date of Patent: Dec. 15, 2015

(54) FLEXIBLE PHOTO-ANODE OF DYE-SENSITIZED SOLAR CELL AND MANUFACTURING METHOD THEREOF

(71) Applicant: NATIONAL CHENG KUNG UNIVERSITY, Tainan (TW)

(72) Inventors: Jih-Jen Wu, Tainan (TW); Geng-Jia Chang, Tainan (TW); Shou-Yen Lin, Tainan (TW); Chun-te Wu, Tainan (TW); Jen-Sue Chen, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 131 days.

(21) Appl. No.: 14/019,052

(22) Filed: Sep. 5, 2013

(65) Prior Publication Data

US 2015/0059844 A1    Mar. 5, 2015

(51) Int. Cl.

| | | |
|---|---|---|
| *H01L 31/00* | (2006.01) | |
| *H01G 9/20* | (2006.01) | |
| *H01L 31/0236* | (2006.01) | |
| *H01L 31/18* | (2006.01) | |

(52) U.S. Cl.
CPC .......... *H01G 9/204* (2013.01); *H01L 31/02366* (2013.01); *H01L 31/18* (2013.01); *H01G 9/2059* (2013.01); *Y10S 977/948* (2013.01)

(58) Field of Classification Search
CPC ... H01G 9/2027; H01G 9/204; H01G 9/2095; H01G 9/2031; H01G 9/2036
See application file for complete search history.

(56) References Cited

U.S. PATENT DOCUMENTS

| | | | |
|---|---|---|---|
| 2005/0268962 A1* | 12/2005 | Gaudiana et al. | 136/255 |
| 2009/0098043 A1* | 4/2009 | Song et al. | 423/622 |
| 2010/0043859 A1 | 2/2010 | Aranami et al. | |
| 2010/0105271 A1* | 4/2010 | Chen et al. | 442/327 |
| 2012/0086002 A1* | 4/2012 | Fleischhaker et al. | 257/43 |
| 2013/0000713 A1* | 1/2013 | Ko et al. | 136/256 |

FOREIGN PATENT DOCUMENTS

| | | | |
|---|---|---|---|
| CN | 101189367 A | | 5/2008 |
| EP | 2600365 A2 * | | 6/2013 |
| TW | 201242903 A | | 11/2012 |

OTHER PUBLICATIONS

Ko et al., "Nanoforest of Hydrothermally Grown Hierarchical ZnO Nanowires for a High Efficiency Dye-Sensitized Solar Cell," Nano Lett., Nov. 2011, 666-671.*

Jiang, et al, Room-Temperature Fast Construction of Outperformed ZnO Nanoarchitectures on Nanowire-Array Templates for Dye-Sensitized Solar Cells, ACS Applied Materials & Interfaces, Jan. 8, 2013, 5, pp. 911-917.

* cited by examiner

*Primary Examiner* — Eli Mekhlin
(74) *Attorney, Agent, or Firm* — Hauptman Ham, LLP

(57) ABSTRACT

A flexible photo-anode of dye-sensitized solar cell and a manufacturing method thereof are provided. The method includes steps of: coating zinc oxide nanoparticles on a flexible substrate to form a seed layer; immersing the flexible substrate into a first reaction solution; heating the seed layer to form a zinc oxide nanowire array; cooling the flexible substrate to the room temperature, immersing it into the second reaction solution, and stirring the second reaction solution, so that the zinc oxide nanowire array forms a cactus-like structure. Thus, the sintering and embossing processes can be prevented.

7 Claims, 4 Drawing Sheets

FLEXIBLE PHOTO-ANODE OF DYE-SENSITIZED SOLAR CELL AND MANUFACTURING METHOD THEREOF

FIELD OF THE INVENTION

The present invention relates to a flexible photo-anode of a dye-sensitized solar cell and a manufacturing method for the flexible photo-anode of a dye-sensitized solar cell, and more particularly to form a zinc oxide nanowire array with a cactus-like structure by a chemical bath deposition method at room temperature.

BACKGROUND OF THE INVENTION

Nano-scale thin film solar cell of the third generation is called dye sensitized solar cell (DSSC), wherein the solar cell has advantages of low material cost, easy processing and simple equipment. The solar cell comprises a substrate and a photo-anode formed on the substrate, the photo-anode comprises a titanium dioxide layer and dyes absorbed in the titanium dioxide layer for absorbing UV light to convert into electric energy by titanium dioxide layer and simultaneously absorbing the visible light to improve energy output efficiency by the dyes. In the traditional technologies, a titanium dioxide film is formed by micron-scale wet coating method, electrophoresis method, screen printing method or blade coating method, and then the titanium dioxide film is sintered to form the titanium dioxide layer.

However, the above-mentioned methods still have the following problems, the production equipment for the micron-scale wet coating method or the electrophoresis method is high cost; the screen printing method and the blade coating method coated are carried out by mechanical compression, so that the titanium oxide layer is not firmly attached on the substrate; after sintering, the quality of the structure of the titanium dioxide layer is affected, the solar cell thus can not be applied to the flexible substrate. Furthermore the titanium dioxide layer must absorb the dyes by being immersed into a dye solution at least eight hours, and the time of the process is relatively long.

Therefore it is necessary to provide a flexible photo-anode of a dye-sensitized solar cell and a manufacturing method for the flexible photo-anode of a dye-sensitized solar cell, so as to form a zinc oxide nanowire array with a cactus-like structure by a chemical bath deposition method at room temperature to avoid the sintering and mechanical compression.

SUMMARY OF THE INVENTION

A primary object of the present invention is to provide a flexible photo-anode of a dye-sensitized solar cell, which is used to form a zinc oxide nanowire array with a cactus-like structure by a chemical bath deposition method at room temperature to avoid the sintering and mechanical compression.

A secondary object of the present invention is to provide a manufacturing method for the flexible photo-anode of a dye-sensitized solar cell, which is used to form a zinc oxide nanowire array with a cactus-like structure by a chemical bath deposition method at room temperature to simplify the manufacturing process, reduce the cost and improve the application of the flexible product.

The technical solution of the present invention is to provide a manufacturing method for a flexible photo-anode of a dye-sensitized solar cell, comprising steps of: (a) preparing a plurality of zinc oxide nanoparticles; (b) coating the zinc oxide nanoparticles on a flexible substrate as a seed layer; (c) immersing the flexible substrate into a first reaction solution, the first reaction solution comprising zinc acetate and hexamethylenetetramine; (d) heating the first reaction solution to 90-100° C., so as to form a zinc oxide nanowire array on the seed layer; and (e) taking out the flexible substrate from the first reaction solution, cooling the flexible substrate to the room temperature, immersing the flexible substrate into a second reaction solution followed by a stirring operation, so that a plurality of spurs are extended from each of nanowires of the zinc oxide nanowire array to form a cactus-like structure, wherein the second reaction solution comprises zinc ions and alkali.

In one embodiment of the present invention, the stirring operation is to stir the second reaction solution 2 to 10 minutes at a rotation speed of 300 to 1500 rpm.

In one embodiment of the present invention, the particle sizes of the zinc oxide nanoparticles are 5 to 10 nm.

In one embodiment of the present invention, the zinc acetate in the first reaction solution has a molar concentration from 0.01 to 0.03 mole/L.

In one embodiment of the present invention, the hexamethylenetetramine in the first reaction solution has a molar concentration from 0.01 to 0.03 mole/L.

In one embodiment of the present invention, the zinc ions in the second reaction solution are selected from zinc nitrate, zinc acetate, zinc chloride or zinc sulfate.

In one embodiment of the present invention, the alkali in the second reaction solution is sodium hydroxide or potassium hydroxide.

In one embodiment of the present invention, the zinc ions in the second reaction solution have a molar concentration from 0.4 to 0.7 mole/L, the alkali in the second reaction solution has a molar concentration from 3 to 5 mole/L.

In one embodiment of the present invention, after the step (e), the method further comprises a step of: (f) coating a plurality of zinc oxide nanoparticles on the zinc oxide nanowire array as a light scattering layer, and immersing the flexible substrate into the second reaction solution followed by a stirring operation.

To achieve the above object, the present invention provides a flexible photo-anode of a dye-sensitized solar cell which comprises a flexible substrate; a zinc oxide nanowire array formed on the flexible substrate; and a light scattering layer formed on the zinc oxide nanowire array, wherein each of nanowires of the zinc oxide nanowire array has a cactus-like structure and a plurality of spurs are extended from each of the nanowires.

In one embodiment of the present invention, the flexible substrate is a transparent nonmetallic substrate.

In one embodiment of the present invention, the thickness of the zinc oxide nanowire array is 3 to 12 μm.

In one embodiment of the present invention, the light scattering layer comprises a plurality of zinc oxide nanoparticles.

As described above, forming a zinc oxide nanowire array with the cactus-like structure by chemical bath deposition method at room temperature, the titanium oxide layer is replaced, so as to avoid the sintering and mechanical compression in the process, and to simplify the manufacturing process, reduce the cost and improve the application of the flexible product.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Referring now to FIGS. 1-4, a manufacturing method for a flexible photo-anode of a dye-sensitized solar cell according to an embodiment of the present invention is illustrated and comprises steps of: (S1) forming a seed layer 3 on the flexible substrate 2; (S2) immersing the flexible substrate 2 by a chemical bath deposition method; (S3) immersing the flexible substrate 2 by a first chemical bath deposition method; and (S4) immersing the flexible substrate 2 by a second chemical bath deposition method. The present invention will be discussed in more detail hereinafter.

Figure 1:
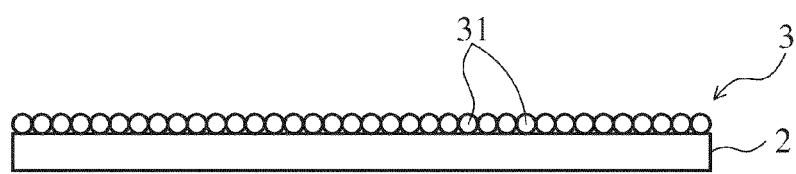
FIGS. 1-4 are schematic views of a manufacturing method for a flexible photo-anode of a dye-sensitized solar cell according to an embodiment of the present invention.

Referring now to FIG. 1, the step (S1) of the manufacturing method for a flexible photo-anode of a dye-sensitized solar cell according to the embodiment of the present invention is firstly to form a seed layer 3 on the flexible substrate 2. As shown, a plurality of zinc oxide nanoparticles 31 are prepared in advance, wherein the particle diameter of the zinc oxide nanoparticles are 5 to 10 nm, the zinc oxide nanoparticles 31 are coated on the flexible substrate 2 by sputtering or spin coating, so as to be a ZnO seed layer 3.

Figure 2:
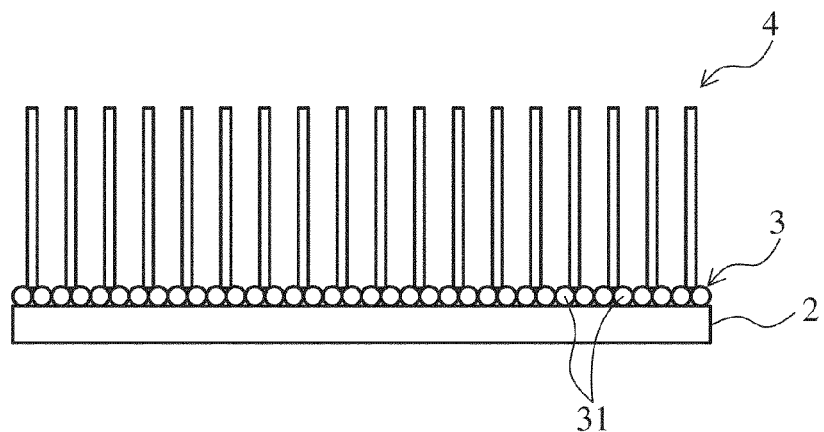

Referring now to FIG. 2, the step (S2) is then to immerse the flexible substrate 2 into a first reaction solution (not-shown) by a chemical bath deposition method, wherein the first reaction solution comprises zinc acetate and hexamethylenetetramine, the zinc acetate in the first reaction solution has a molar concentration from 0.01 to 0.03 mole/L, the hexamethylenetetramine in the first reaction solution has a molar concentration from 0.01 to 0.03 mole/L. Then, the first reaction solution is heat to 90-100° C., so as to form a zinc oxide nanowire array 4 on the seed layer 3.

It should be noted that, the formation of the zinc oxide nanowire array 4 requires to use the zinc oxide as a precursor, i.e. reacting zinc source with alkali. In the present embodiment, the zinc source in the first reaction solution is zinc nitrate ($Zn(NO_3)_2$) or zinc acetate ($Zn(CH_3COO)_2 \cdot 2H_2O$), and the alkali in the first reaction solution is hexamethylenetetramine ($C_6H_{12}N_4$) or ammonia ($NH_4OH$), wherein the reaction temperature is 80 to 100° C. The precursor of zinc oxide nanowire array 4 according to the preferred embodiment is zinc acetate and hexamethylenetetramine, wherein the reaction temperature is 95° C.

Figure 3:
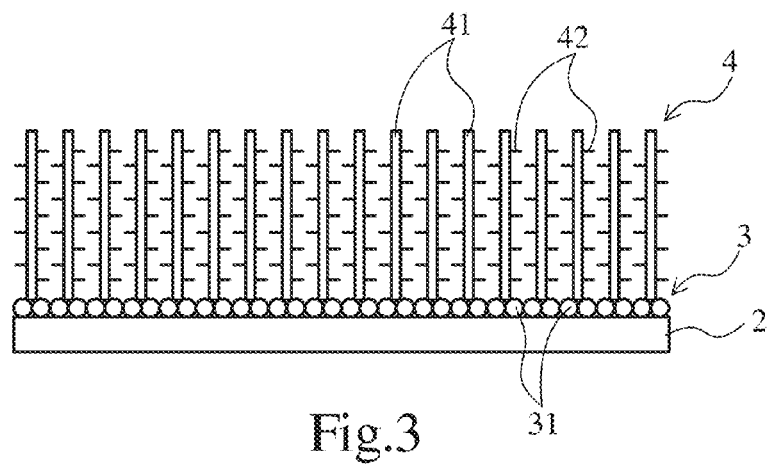

Referring now to FIG. 3, the step (S3) is then to immerse the flexible substrate 2 into a second reaction solution (no shown) by a first chemical bath deposition method, followed by taking out the flexible substrate 2 from the first reaction solution and cooling the flexible substrate 2 to the room temperature, wherein the second reaction solution comprises zinc ions and alkali, the zinc ions in the second reaction solution has a molar concentration from 0.4 to 0.7 mole/L, the alkali in the second reaction solution has a molar concentration from 3 to 5 mole/L, the zinc ions in the second reaction solution are selected from zinc nitrate ($Zn(NO_3)_2$), zinc acetate ($Zn(CH_3COO)_2 \cdot 2H_2O$), zinc chloride ($ZnCl_2$) or zinc sulfate ($ZnSO_4$). The alkali in the second reaction solution has a molar concentration from 3 to 5 mole/L, wherein the alkali in the second reaction solution is selected from sodium hydroxide, potassium hydroxide or other alkaline earth metal oxide. Than, followed by a stirring operation, the stirring operation is to stir the second reaction solution 2 to 10 minutes at a rotation speed of 300 to 1500 rpm. In the embodiment, the stirring operation is preferably to stir the second reaction solution 4 minutes at a rotation speed of 700 rpm, so that a plurality of spurs 42 are extended from each of nanowires 41 of the zinc oxide nanowire array 4 to form a cactus-like structure.

Figure 4:
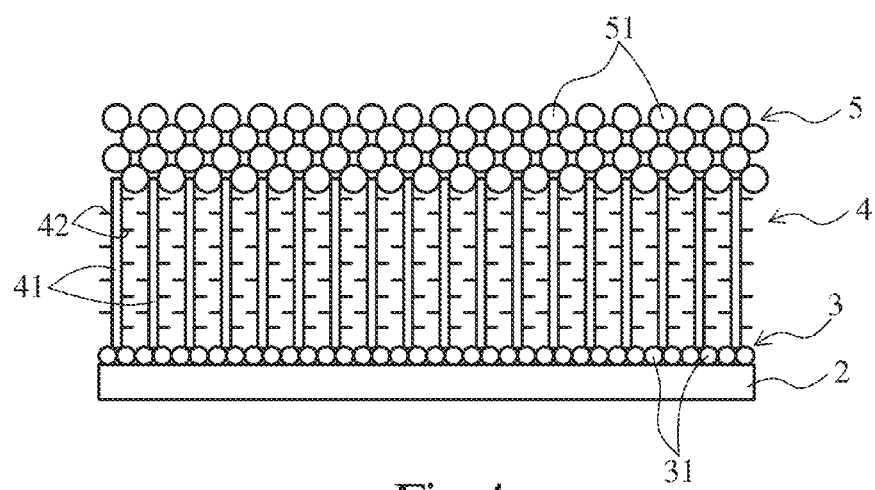

Referring now to FIG. 4, the step (S4) is then to coat a plurality of zinc oxide nanoparticles 51 on the zinc oxide nanowire array 4 as a light scattering layer 5, and to immerse the flexible substrate 2 into a second reaction solution by a second chemical bath deposition method, followed by a stirring operation, wherein the stirring operation is to stir the second reaction solution 4 minutes at a rotation speed of 700 rpm, so as to improve the attachment between the nanoparticles 51 and the connection between the nanoparticle 51 and the zinc oxide nanowire array 4.

Figure 5A:
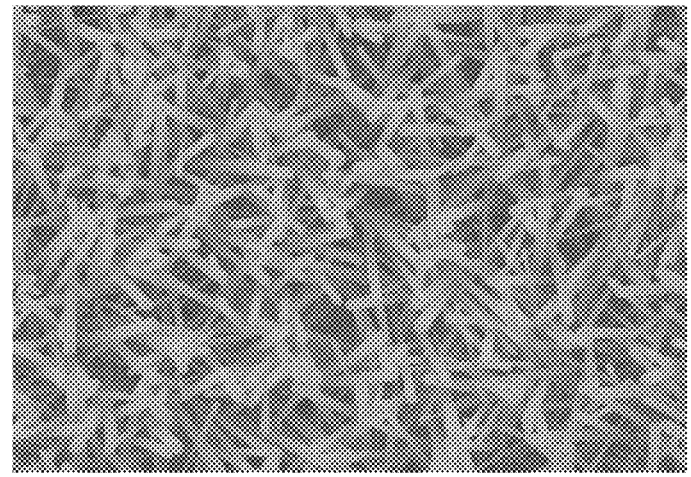
FIG. 5A is a crystal picture illustrating a structural top view of a zinc oxide nanowire array with a one dimensional structure according to FIG. 2.
Figure 5B:
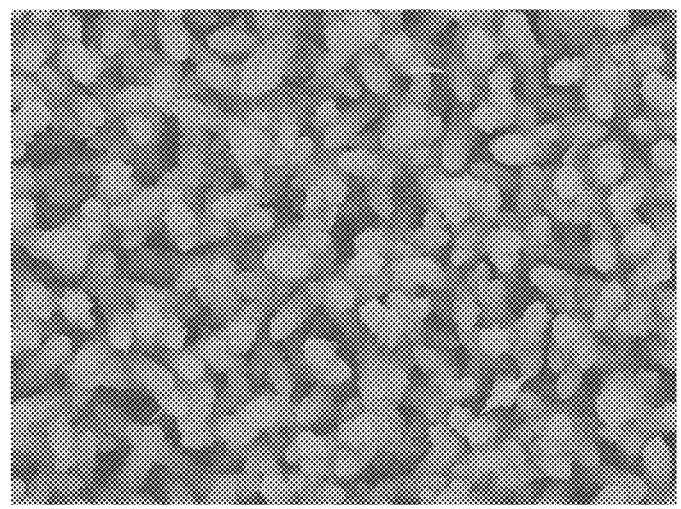
FIG. 5B is a crystal picture illustrating a structural top view of a zinc oxide nanowire array with a cactus-like structure according to FIG. 3.
Figure 6:
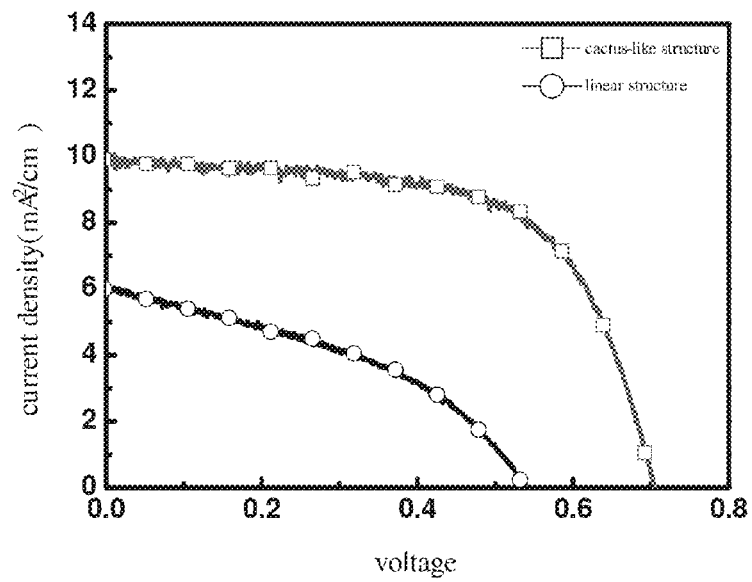
FIG. 6 is a voltage-current density curve diagram of the a zinc oxide nanowire array with the one dimensional structure and the zinc oxide nanowire array with the cactus-like structure.

Referring now to FIGS. 5A and 5B, FIG. 5A is a crystal picture illustrating a structural top view of the zinc oxide nanowire array 4 with the one dimensional structure according to FIG. 2, and FIG. 5B is a crystal picture illustrating a structural top view of the zinc oxide nanowire array 4 of the cactus-like structure according to FIG. 3. Furthermore, FIG. 6 is an experimental data of photovoltaic performances (voltage-current density curve). Referring to FIG. 6, the conductivity of the zinc oxide nanowire array 4 of the cactus-like structure is better than the conductivity of the zinc oxide nanowire array 4 of the one dimensional structure.

As described above, the adhesion between the light scattering layer 5 and the zinc oxide nanowire array 4 is improved by forming the zinc oxide nanowire array 4 on the seed layer 3, forming a cactus-like structure on each of nanowires 41 of the zinc oxide nanowire array 4 by the first chemical bath deposition method and executing the second chemical bath deposition method after coating the light scattering layer 5.

The traditional titanium oxide layer can be replaced with the zinc oxide nanowire array 4 with the cactus-like structure formed by the first chemical bath deposition method, and the zinc oxide nanowire array 4 with the cactus-like structure can be used as a photo-anode, so as to avoid the sintering and mechanical compression in the process, and to simplify the manufacturing process, reduce the cost and improve the application of the flexible product. Additionally, the adhesion between the nanoparticles 51 can be improved by the second chemical bath deposition method, so that the mechanical strength and conductivity of the light scattering layer 5 are improved.

Figure 7:
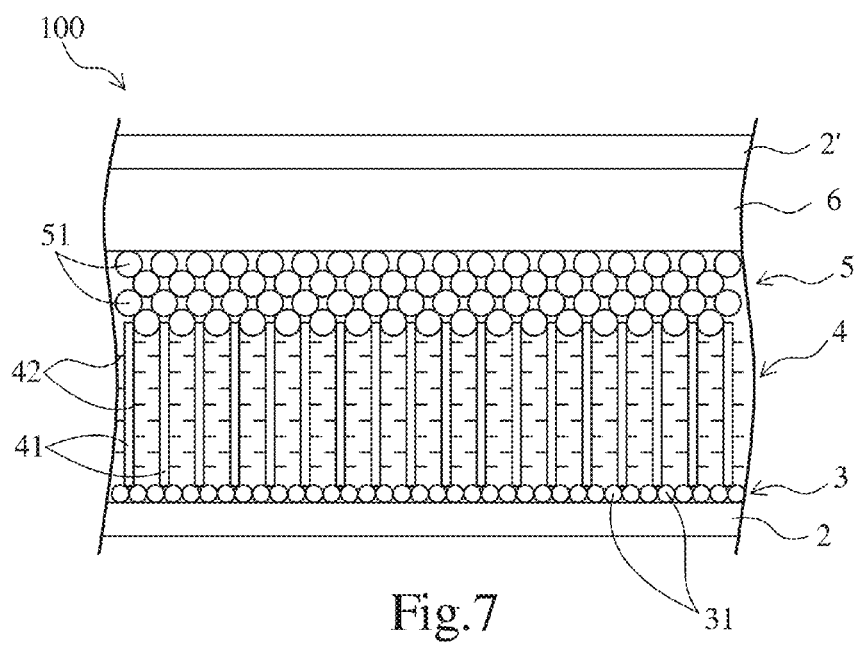
FIG. 7 is a schematic view of a flexible photo-anode of a dye-sensitized solar cell according to an embodiment of the present invention.

Referring now to FIG. 7, a flexible photo-anode of a dye-sensitized solar cell 100 according to an embodiment of above method is illustrated and comprises two flexible substrates 2, 2', a seed layer 3, a zinc oxide nanowire array 4, a light scattering layer 5 and an electrolyte layer 6. The flexible substrates 2, 2' are transparent nonmetallic substrates, and an interval is formed between the two substrates 2, 2', wherein the seed layer 3 is coated on the flexible substrate 2, the zinc oxide nanowire array 4 is formed on the flexible substrate 2, the thickness of the zinc oxide nanowire array 4 is 3 to 12 μm, the nanowires 41 of the zinc oxide nanowire array 4 are extended toward flexible substrate 2' from the seed layer 3, each of nanowires 41 of the zinc oxide nanowire array 4 is a cactus-like structure and a plurality of spurs are extended from each of the nanowires 4, the light scattering layer 5 comprises a plurality of zinc oxide nanoparticles 51, the zinc oxide nanoparticles 51 are formed on the zinc oxide nanowire array 4, and the electrolyte layer 6 is filled between the flexible substrate 2' and the light scattering layer 5.

As described above, the traditional titanium oxide layer can be replaced with the zinc oxide nanowire array 4 with the cactus-like structure formed by the first chemical bath deposition method, and the zinc oxide nanowire array 4 with the cactus-like structure can be used as a photo-anode, so as to avoid the sintering and mechanical compression in the process, and to simplify the manufacturing process, reduce the cost and improve the application of the flexible product. Additionally, the adhesion between the nanoparticles 51 can be improved by forming the zinc oxide nanoparticles 51 on the zinc oxide nanowire array 4, so that the inter-necking and conductivity of the light scattering layer 5 are improved.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A manufacturing method for a flexible photo-anode of a dye-sensitized solar cell, comprising steps of:
    (a) preparing a plurality of zinc oxide nanoparticles;
    (b) coating the zinc oxide nanoparticles on a flexible substrate as a seed layer;
    (c) immersing the flexible substrate into a first reaction solution, the first reaction solution comprising zinc acetate and hexamethylenetetramine;
    (d) heating the first reaction solution to 90-100° C., so as to form a zinc oxide nanowire array on the seed layer; and
    (e) taking out the flexible substrate from the first reaction solution, cooling the flexible substrate to room temperature and immersing the flexible substrate into a second reaction solution followed by a stirring operation at room temperature, so that a plurality of spurs extend from each nanowire of the zinc oxide nanowire array to form a cactus-like structure, wherein the second reaction solution comprises zinc ions and alkali, the stirring operation is to stir the second reaction solution for 2 to 10 minutes at a rotation speed of 300 to 1500 rpm, the zinc ions in the second reaction solution have a molar concentration from 0.4 to 0.7 mole/L, and the alkali in the second reaction solution has a molar concentration from 3 to 5 mole/L.

2. The manufacturing method according to claim 1, wherein the particle sizes of the zinc oxide nanoparticles are 5 to 10 nm.

3. The manufacturing method according to claim 1, wherein the zinc acetate in the first reaction solution has a molar concentration from 0.01 to 0.03 mole/L.

4. The manufacturing method according to claim 1, wherein the hexamethylenetetramine in the first reaction solution has a molar concentration from 0.01 to 0.03 mole/L.

5. The manufacturing method according to claim 1, wherein the zinc ions in the second reaction solution are selected from zinc nitrate, zinc acetate, zinc chloride or zinc sulfate.

6. The manufacturing method according to claim 1, wherein the alkali in the second reaction solution is sodium hydroxide or potassium hydroxide.

7. The manufacturing method according to claim 1, wherein after the step (e), the method further comprises a step of: (f) coating a plurality of zinc oxide nanoparticles on the zinc oxide nanowire array as a light scattering layer, and immersing the flexible substrate into the second reaction solution followed by a stifling operation.

* * * * *